(12) United States Patent
Satoh et al.

(10) Patent No.: US 10,386,874 B2
(45) Date of Patent: Aug. 20, 2019

(54) VOLTAGE TO CURRENT CONVERTER

(71) Applicant: Kabushiki Kaisha Toshiba, Minato-ku, Tokyo (JP)

(72) Inventors: Yuji Satoh, Kawasaki Kanagawa (JP); Jun Deguchi, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 26 days.

(21) Appl. No.: 15/454,554

(22) Filed: Mar. 9, 2017

(65) Prior Publication Data

US 2017/0262005 A1    Sep. 14, 2017

Related U.S. Application Data

(60) Provisional application No. 62/307,770, filed on Mar. 14, 2016.

(51) Int. Cl.
*G05F 1/56* (2006.01)
*H01L 27/105* (2006.01)
*H03K 5/01* (2006.01)

(52) U.S. Cl.
CPC .......... *G05F 1/561* (2013.01); *H01L 27/1057* (2013.01); *H03K 5/01* (2013.01)

(58) Field of Classification Search
CPC ........ G05F 1/561; H03K 5/01; H01L 27/1057
See application file for complete search history.

(56) References Cited

U.S. PATENT DOCUMENTS

| | | | |
|---|---|---|---|
| 5,118,966 A | 6/1992 | Kumada | |
| 7,061,225 B2* | 6/2006 | Yang | H02M 3/33507 324/103 P |
| 7,271,642 B2* | 9/2007 | Chen | H02M 3/07 315/291 |
| 7,982,506 B2 | 7/2011 | Kitsunezuka et al. | |
| 2011/0234276 A1 | 9/2011 | Kaneko | |

FOREIGN PATENT DOCUMENTS

| | | |
|---|---|---|
| JP | 2011-065208 A | 3/2011 |
| JP | 2014023 A | 1/2014 |
| WO | 2008-149881 A1 | 12/2008 |
| WO | 2013-121741 A1 | 8/2013 |

* cited by examiner

*Primary Examiner* — Jung Kim
(74) *Attorney, Agent, or Firm* — White & Case LLP

(57) ABSTRACT

The voltage to current converter according to the present embodiments includes a charge transfer device, a smoother and a current generator. The charge transfer device accumulates charge corresponding to an input voltage, and transfers the accumulated charge. The smoother accumulates the transferred charge to smooth an output voltage. The current generator generates a current corresponding to the input voltage by use of a current corresponding to the charge accumulated in the smoother.

4 Claims, 16 Drawing Sheets

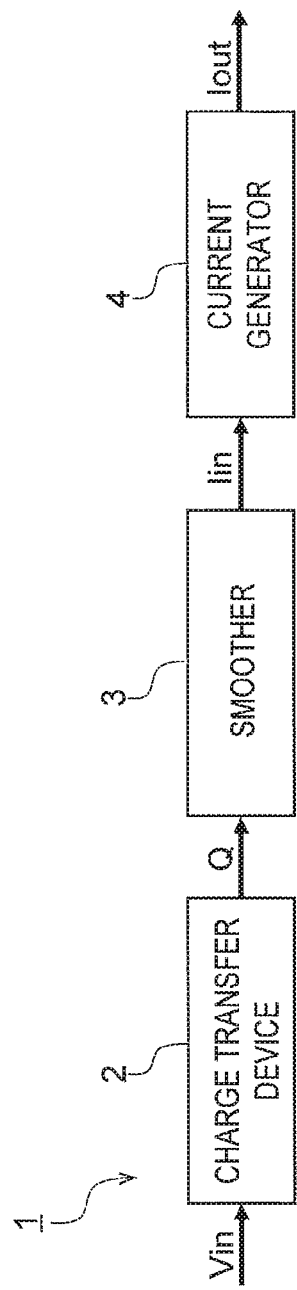
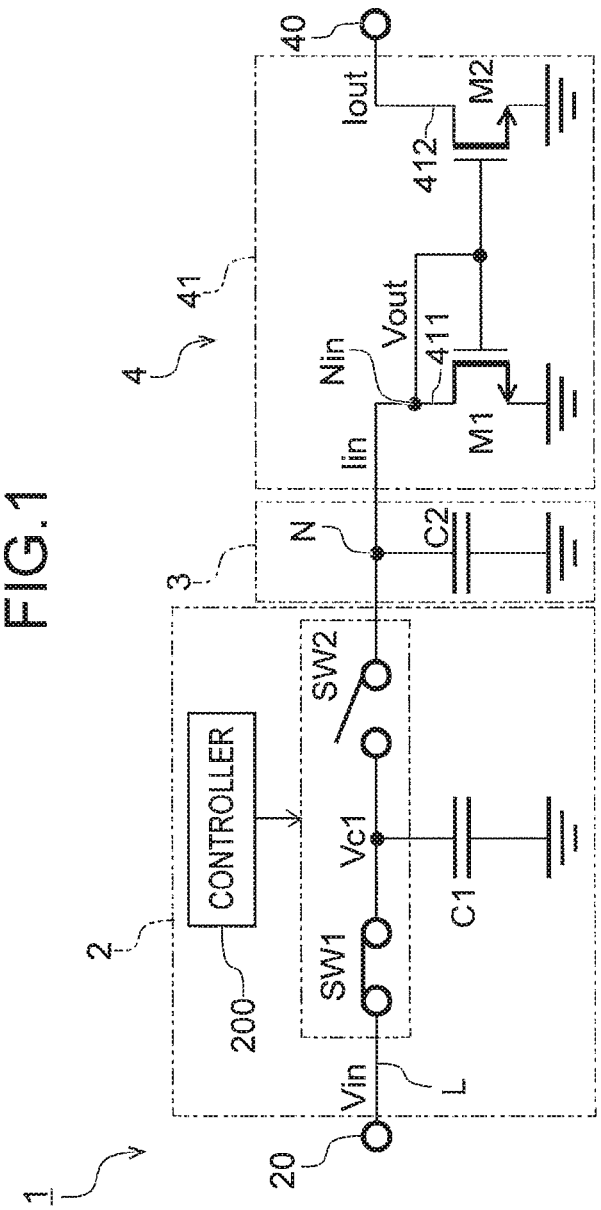
FIG.1
FIG.2

VOLTAGE TO CURRENT CONVERTER

CROSS-REFERENCE TO RELATED APPLICATIONS

This application is based upon and claims the benefit of priority from the prior U.S. Provisional Patent Application No. 62/307,770 filed on Mar. 14, 2016, the entire contents of which are incorporated herein by reference.

FIELD

Embodiments relate to a voltage to a current converter.

BACKGROUND

A voltage to current converter that converts an input voltage to a current is used in various kinds of devices driven by a current. For such a voltage to current converter, techniques for securing linearity between a voltage and a current as well as an output range of the current are suggested. One of them is a voltage to current converter using an operational amplifier.

However, the voltage to current converter using an operational amplifier has a problem of requiring large power consumption.

BRIEF DESCRIPTION OF THE DRAWINGS

FIG. 1 is a block diagram showing a voltage to current converter of a first embodiment;

FIG. 2 is a circuit diagram showing the voltage to current converter of the first embodiment;

DETAILED DESCRIPTION

Figure 3:
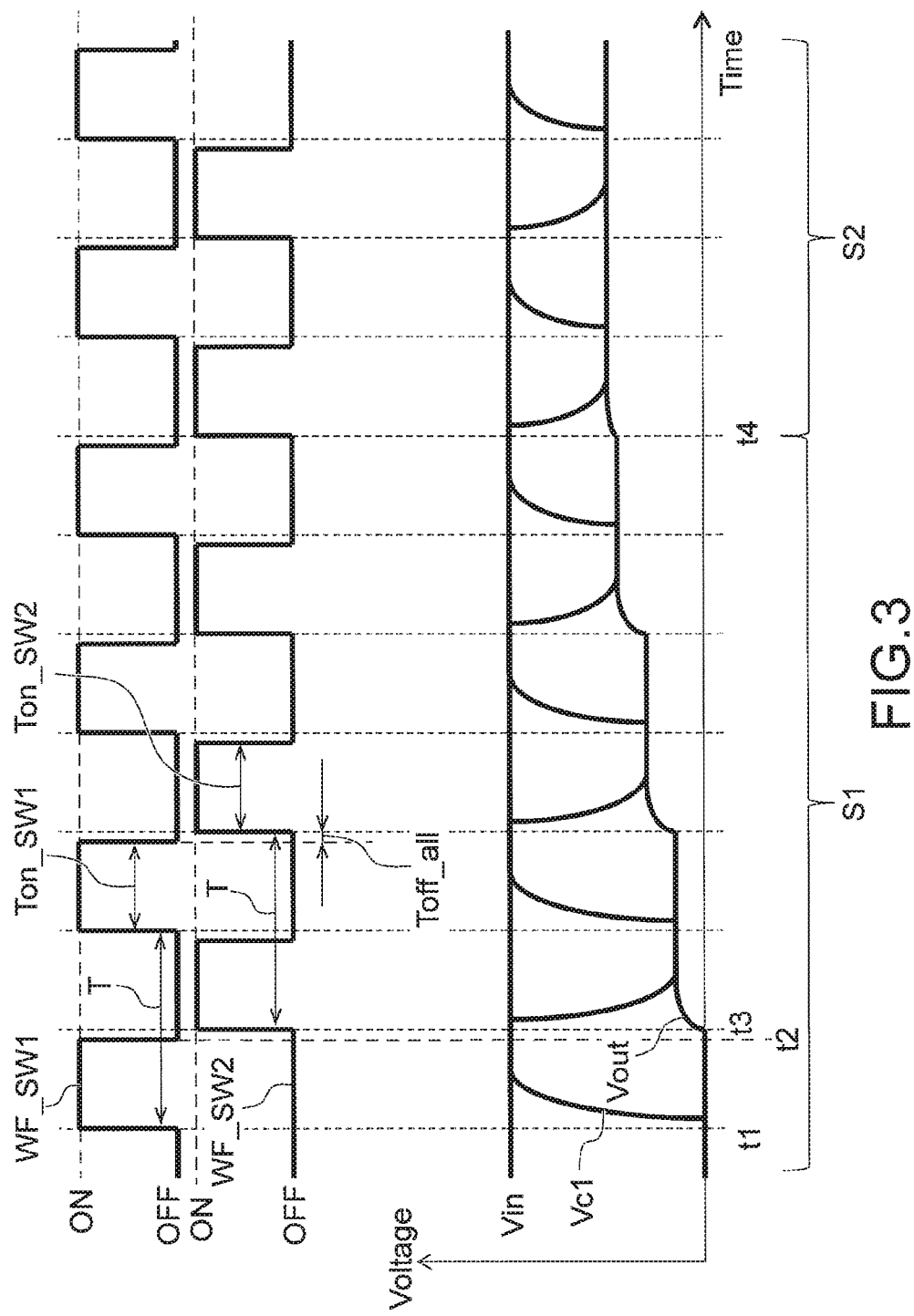
FIG. 3 is a waveform diagram showing an operation example of the voltage to current converter of the first embodiment.

Each of the voltage to current converters according to the present embodiments includes a charge transfer device, a smoother and a current generator. The charge transfer device accumulates charge corresponding to an input voltage, and transfers the accumulated charge. The smoother accumulates the transferred charge to smooth an output voltage. The current generator generates a current corresponding to the input voltage by use of a current corresponding to the charge accumulated in the smoother.

Embodiments will now be explained with reference to the accompanying drawings. The present invention is not limited to the embodiments.

First Embodiment

FIG. 1 is a block diagram showing a voltage to current converter 1 of the first embodiment. The voltage to current converter 1 can be used in, for example, a power source, a signal source, a sensor or others driven by a current. Moreover, the voltage to current converter 1 can be configured by, for example, a semiconductor integrated circuit. The voltage to current converter 1 includes a charge transfer device 2, a smoother 3 and a current generator 4.

The charge transfer device 2 transfers accumulated charge Q to the smoother 3 in accordance with an input voltage Vin, that is, a power-supply voltage.

The smoother 3 accumulates the charge Q to smooth an output voltage. Moreover, during the process of smoothing, the smoother 3 outputs a current Iin converted corresponding to the accumulated charge Q to the current generator 4.

The current generator 4 generates a current Iout corresponding to the input voltage Vin by use of the current Iin and outputs thereof.

FIG. 2 is a circuit diagram showing a specific configuration example of the voltage to current converter 1 of the first embodiment.

(Charge Transfer Device 2)

The charge transfer device 2 includes a first capacitor C1, a first switch SW1, a second switch SW2 and a controller 200.

The first switch SW1 and the second switch SW2 are connected in series between an input terminal 20 and the current generator 4. The first switch SW1 is connected between the input terminal 20 and one end of the first capacitor C1. The second switch SW2 is connected between the one end of the first capacitor C1 and the current generator 4. The controller 200 controls turning on and off of the switches SW1 and SW2. For example, the controller 200 alternately turns on and off of the switches SW1 and SW2 every period T. The switches SW1 and SW2 are, for example, MOS transistors or others. The input terminal 20 is an external input terminal to which the input voltage Vin is input.

The other end of the first capacitor C1 is grounded. The first capacitor C1 accumulates charge Q1 corresponding to the input voltage Vin when the first switch SW1 is on and the second switch SW2 is off. Moreover, when the first switch SW1 is off and the second switch SW2 is on, the first capacitor C1 outputs the accumulated charge Q1 to the smoother 3. For example, in a steady state in which an output voltage Vout of the smoother 3 is stable, the first capacitor C1 accumulates the charge Q1 of a value C1 (Vin-Vout), which is obtained by multiplying a difference between the input voltage Vin and the output voltage Vout by a capacity C1 of the first capacitor C1. In other words, the first capacitor C1 is able to obtain charge having linearity with respect to the input voltage Vin.

By on and off operations of the switches SW1 and SW2, the charge Q1 is discretely transferred to the smoother 3.

(Smoother 3)

The smoother 3 includes a second capacitor C2. The second capacitor C2 accumulates or discharges charge Q2 in response to turning on or off of the second switch SW2. Moreover, the second capacitor C2 converts the charge Q2 into a constant current having continuous linearity. Since the second capacitor C2 is a smoothing capacity, it is desirable that the second capacitor C2 has a large capacity. One end of the second capacitor C2 is connected to one other end of the second switch SW2, and the other end of the second capacitor C2 is grounded.

The current converted by the second capacitor C2 has a value obtained by dividing an integrated value of charge with a period T as an integration interval by the period T. Since the charge Q1 has linearity, the current Iin also has linearity. Consequently, with the second capacitor C2, it is possible to obtain a current having linearity with respect to the input voltage Vin.

(Current Generator 4)

The current generator 4 includes a current mirror circuit 41 that outputs the current Iout. The current mirror circuit 41 includes a first current path 411 that passes the current Iin corresponding to the accumulated charge Q2 of the second capacitor C2 and a second current path 412 that passes the current Iout proportional to the current Iin. More specifically, the current mirror circuit 41 includes an n-type first MOS transistor M1 that is diode-connected, and an n-type second MOS transistor M2 that is gated in common with the first MOS transistor M1.

In the first MOS transistor M1, a drain is connected to the one end of the second capacitor C2, and a source is grounded. In the second MOS transistor M2, a drain is connected to an output terminal 40, and a source is grounded. The current Iout is output from the output terminal 40.

With the current mirror circuit 41, by causing the second MOS transistor M2 to copy the current Iin input to the drain (the current input node Nin) of the first MOS transistor M1, it is possible to obtain the output current Iout proportional to the input current Iin. In the period T, when fluctuations in the input voltage Vin are small, the input current Iin has linearity with respect to the input voltage Vin. This is referred to as "small signal". In the small signal, the input current Iin has linearity with respect to the input voltage Vin. Therefore, the output current Iout also has linearity with respect to the input voltage Vin.

Note that, in FIG. 1, the other ends of the capacitors C1 and C2, and the sources of the MOS transistors M1 and M2 are all grounded. It is unnecessary to limit the embodiment to the configuration like this, and, for example, a power supply may be connected in place of the ground. In this case, the MOS transistors M1 and M2 may be changed to those of p-type. Moreover, the other end of each element may be connected to a node of an arbitrary potential or the like.

Moreover, the gate width of the second MOS transistor M2 may be the same as or different from the gate width of the first MOS transistor M1. In addition, the capacitors C1 and C2 are elements independent from wiring or the MOS transistors, and may have a MOM (Metal-Oxide-Metal) capacity, a MIM (Metal-Insulator-Metal) capacity or a MOS capacity.

(Operation Example)

FIG. 3 is a waveform diagram showing an operation example of the voltage to current converter 1 of the first embodiment. In FIG. 3, a waveform WF_SW1 of the first switch SW1, a waveform WF_SW2 of the second switch SW2, the input voltage Vin, a potential Vc1 of the one end of the first capacitor C1 and the output voltage Vout of the second capacitor C2 are shown. Note that the output voltage Vout corresponds to the gate input of the current mirror circuit 41. Moreover, since the other end of the first capacitor C1 in FIG. 2 is grounded, Vc1 is also a voltage between both ends of the first capacitor C1.

As indicated by the waveforms WF_SW1 and WF_SW2 in FIG. 3, The controller 200 performs control that turns off the second switch SW2 during an on-period Ton_SW1 in which the first switch SW1 is on, and performs control that turns off the first switch SW1 during an on-period Ton_SW2 in which the second switch SW2 is on. Moreover, the controller 200 performs control that provides an off-period Toff_all in which both first switch SW1 and second switch SW2 are off between the on-period Ton_SW1 and the on-period Ton_SW2. Turning on of both switches SW1 and SW2 can be prevented by providing the off-period Toff_all. This prevents a current path for discharge from the second capacitor C2 side to the first capacitor C1 side from appearing, and therefore, it is possible to eliminate a short circuit condition between the input voltage Vin and the output voltage Vout. As a result, an unintended current can be prevented from flowing into and flowing out of the capacitors C1 and C2.

After the voltage to current converter 1 is started up, the first switch SW1 is turned on at the time point t1, and the input voltage Vin is input to the first capacitor C1 through the input terminal 20. The first capacitor C1 accumulates charge corresponding to the input voltage Vin. The charge Q1 accumulated in the first capacitor C1 at the beginning of the startup of the voltage to current converter 1 is: Q1=C1×Vin.

After the first switch SW1 is turned off at the time point t2, the second switch SW2 is turned on at the time point t3, and the charge accumulated in the first capacitor C1 is transferred to the second capacitor C2. The charge Q to be transferred is represented by the following expression.

$$Q = C1(Vin - Vout) \quad (1)$$

Note that, at the beginning of startup of the voltage to current converter 1, since sufficient charge is not accumulated in the second capacitor C2, the second capacitor C2 cannot fulfill the function of smoothing the output voltage Vout sufficiently. Consequently, at the beginning of startup of the voltage to current converter 1, the output voltage Vout is not stable and brought into a transient state S1.

After the time point t3, sufficient charge is accumulated in the second capacitor C2 by alternately repeating on and off of the switches SW1 and SW2. Accordingly, the second capacitor C2 is able to smooth the output voltage Vout and stabilize thereof in a constant value. In the example of FIG. 3, the output voltage Vout can be maintained in a steady state S2 after the time point t4. Note that, in the steady state S2, amplitude of the output voltage Vout rises C1/C2 fold of the input voltage Vin. Moreover, the potential Vc1 repeats the change to the input potential Vin by turning on of the first switch SW1 and the change to the output potential Vout by turning off of the first switch SW1.

The output voltage Vout is input to a common gate of the MOS transistors M1 and M2. The first MOS transistor M1 operates to pass the input current Iin corresponding to the charge Q2. Specifically, the first MOS transistor M1 operates in any of a saturation region and a weak inversion region in response to a magnitude of the input current Iin. Note that, in the steady state S2, the input current Iin is stabilized in a constant value.

Moreover, the second MOS transistor M2 passes a current (b/a)×Iin, which is obtained by multiplying the input current Iin by a ratio of a gate width a of the first MOS transistor M1 to a gate width b of the second MOS transistor M2, as the output current Iout.

Here, the operation of the first MOS transistor M1 can be regarded as the small signal. In other words, a drain current of the first MOS transistor M1 can be subjected to linear approximation as a product gm1×Vout of a transconductance gm1 of the first MOS transistor M1 and a gate voltage Vout. Accordingly, the charge Q consumed in every period T in the first MOS transistor M1 is represented by the following expression.

$$Q = gm1 \times Vout \times T \quad (2)$$

Moreover, similarly, in consideration of the operation of the second MOS transistor M2 as the small signal, the charge Q consumed in every period T in the second MOS transistor M2 is represented by the following expression.

$$Q = gm2 \times Vout \times T \quad (3)$$

Further, expression (3) can be deformed as the following expression.

$$Iout = gm2 \times Vout \quad (4)$$

Then, by eliminating Vout and Q from expressions (1), (2) and (4) and approximating by gm1×T>>C1, the following expression is derived.

(Expression 1)

$$Iout \propto \frac{gm2 \times C1}{(gm1 \times T + C1)} Vin \approx \frac{gm2 \times C1}{gm1 \times T} Vin \quad (5)$$

The output current Iout can be approximated by a linear expression of the input voltage Vin.

In other words, with the voltage to current converter 1, it is possible to obtain an output current Iout having high linearity with the input voltage Vin. Consequently, based on the input voltage, the output current can be easily controlled with high accuracy.

Here, assuming that an ideal line, namely, a relation of a linear expression holds true between the input voltage and the output current, the linearity is quantifiable as a difference [%] between the maximum value and the minimum value in the deviation of the output current to the ideal line. In the linearity quantified as described above, the smaller the value, the better. A simulation result of the quantified linearity with respect to the voltage to current converter 1 of the first embodiment was 0.26%.

In contrast thereto, a simulation result of the quantified linearity with respect to a VCC (Voltage-Current Converter) of an amplifier-feedback type, which is an example of a voltage to current converter using an operational amplifier, was 0.51%. In other words, the linearity of the VCC of an amplifier-feedback type was worse than the voltage to current converter 1.

The voltage to current converter 1 is able to realize the linearity as shown in expression (5) by performing voltage-to-current conversion using charge transfer. Consequently, with the voltage to current converter 1, high linearity can be satisfied as compared to the case of using an operational amplifier.

Moreover, since an operational amplifier with large power consumption is not used, the voltage to current converter 1 is able to efficiently perform voltage-to-current conversion with small poser consumption. According to the simulation results, the power consumption of the VCC of an amplifier-feedback type was 3500 nA, whereas the power consumption of the voltage to current converter 1 was 200 nA. Consequently, the voltage to current converter 1 is able to reduce power consumption as compared to the VCC of an amplifier-feedback type.

Moreover, if the first MOS transistor M1 operates in the weak inversion region with less drain current Iin, it is possible to further reduce the power consumption.

Moreover, according to the simulation results, the output range of the voltage to current converter 1 extended from a threshold voltage Vth to the input voltage Vin of the first MOS transistor M1, and thereby a sufficiently wide range was obtained.

The voltage to current converter 1 converts the charge discretized by the charge transfer device 2 into a continuous value by the smoother 3. The current Iin generated from the conversion process can be controlled by a capacity ratio between the first MOS transistor M1 and the second MOS transistor M2. Consequently, a voltage can be converted into a current with simple design.

Moreover, in the first embodiment, a switched capacitor configured with the first capacitor C1 and the switches SW1, SW2 is regarded as a single resistance, and the charge is converted into a constant current by an RC filter configured with the resistance and the second capacitor C2. With such a configuration, since a resistance is not included, the number of parts can be reduced.

As described above, according to the first embodiment, the power consumption can be reduced while improving the linearity of the output current Iout corresponding to the input voltage Vin.

Second Embodiment

Figure 4:
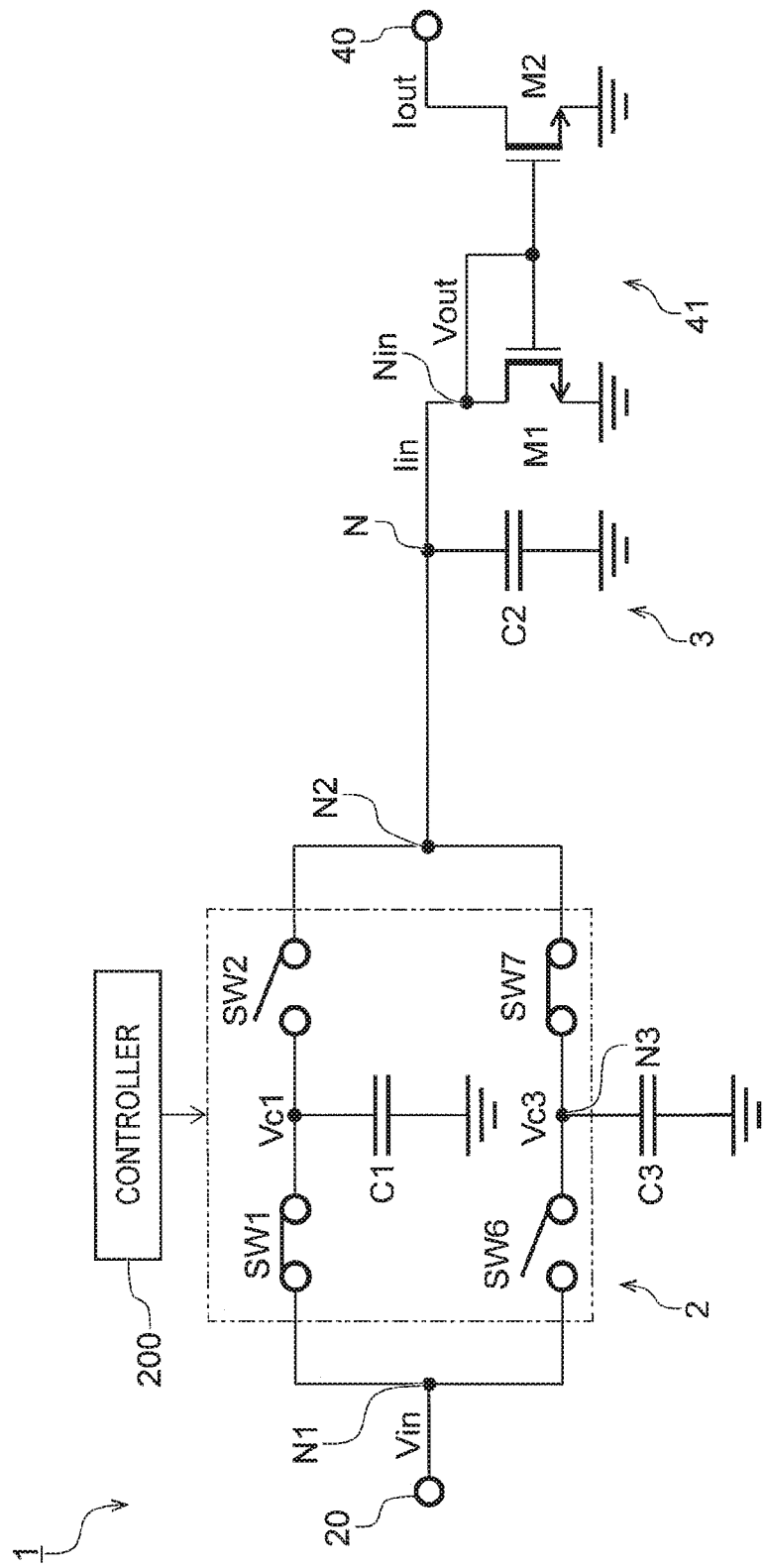
FIG. 4 is a circuit diagram showing a voltage to current converter of a second embodiment.

Next, as a second embodiment, a voltage to current converter including multiple signal paths will be described. Note that, in the second embodiment, configurations corresponding to those in the first embodiment are provided with same reference signs to omit redundant descriptions. FIG. 4 is a circuit diagram showing the voltage to current converter 1 of the second embodiment. In addition to the configuration of the first embodiment, the voltage to current converter 1 in FIG. 4 further includes a sixth switch SW6, a seventh switch SW7 and a third capacitor C3.

The sixth switch SW6 and the seventh switch SW7 are connected in series between an input terminal 20 and a current input node Nin. Moreover, the sixth switch SW6 and the seventh switch SW7 are connected in parallel to the switches SW1 and SW2 between a first node N1 and a second node N2. The first node N1 is a connection point between the input terminal 20 and one end of the first switch SW1. The second node N2 is a connection point between the other end of the second switch SW2 and the current input node Nin.

One end of the third capacitor C3 is connected to a connection point between the sixth switch SW6 and the seventh switch SW7, and the other end thereof is grounded. The capacity of the third capacitor C3 is, for example, the same as the capacity of the first capacitor C1. The capacity of the third capacitor C3 may be different from the capacity of the first capacitor C1.

The third capacitor C3 accumulates charge corresponding to the input voltage Vin when the sixth switch SW6 is on and the seventh switch SW7 is off. Moreover, when the sixth switch SW6 is off and the seventh switch SW7 is on, the third capacitor C3 outputs the accumulated charge to the smoother 3.

Provided with the sixth switch SW6, the seventh switch SW7 and the third capacitor C3, the charge transfer device 2 includes two signal paths between the first node N1 and the second node N2.

Figure 5:
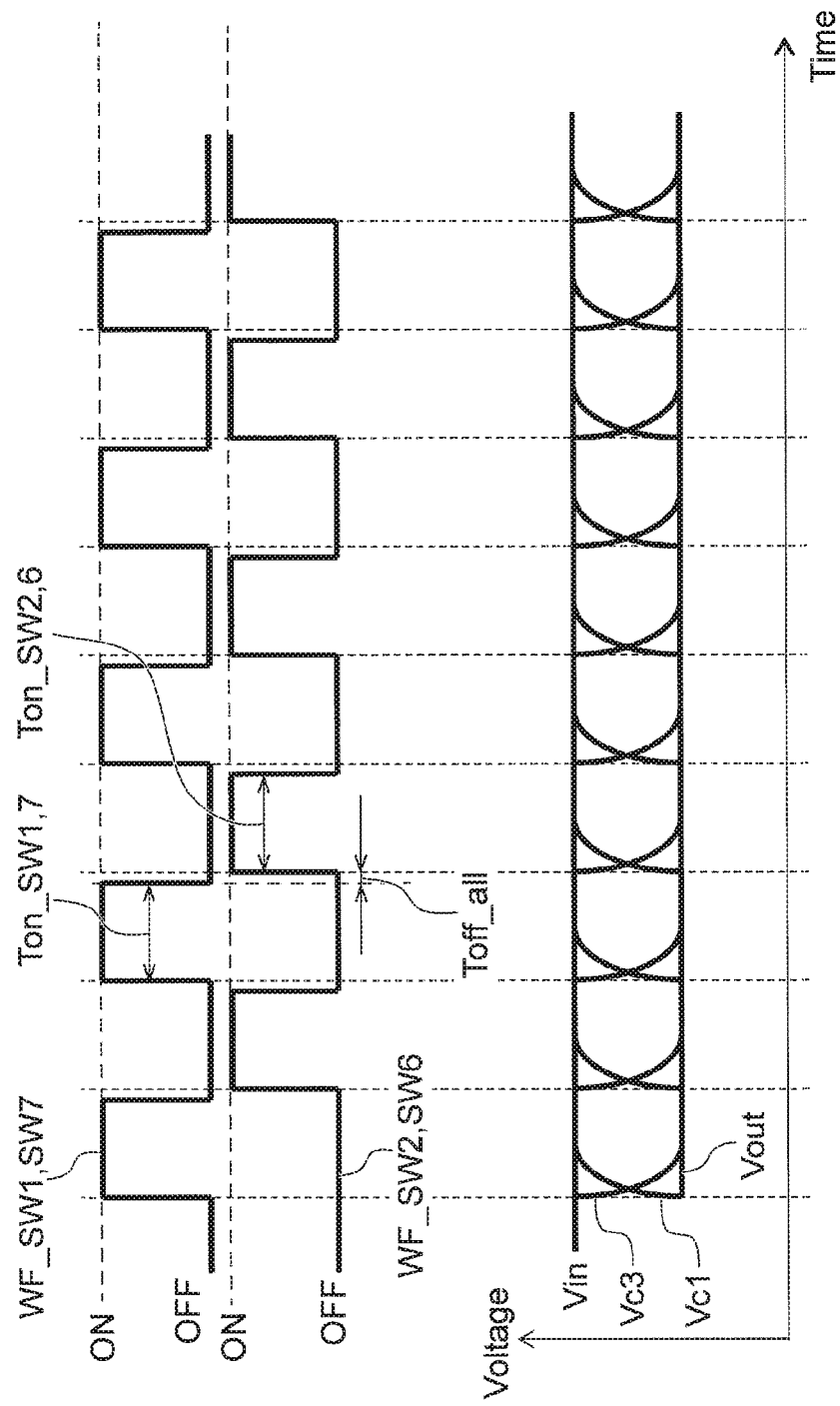
FIG. 5 is a waveform diagram showing an operation example of the voltage to current converter of the second embodiment.

FIG. 5 is a waveform diagram showing an operation example of the voltage to current converter 1 of the second embodiment. Note that, in FIG. 5, the output voltage Vout that has finished the transient state and is in the steady state is shown. Moreover, Vc3 in FIG. 5 is a potential of the one end of the third capacitor C3.

As indicated by the waveforms WF_SW1, SW7 and WF_SW2, SW6 in FIG. 5, the controller 200 performs control that synchronizes the first switch SW1 and the seventh switch SW7, synchronizes the second switch SW2 and the sixth switch SW6, and turns on or off. Moreover, the controller 200 performs control that turns off the switches SW2 and SW6 during an on-period Ton_SW1, 7 in which the switches SW1 and SW7 are on. Moreover, the controller 200 performs control that turns off the switches SW1 and SW7 during an on-period Ton_SW2, 6 in which the switches SW2 and SW6 are on.

Moreover, the controller 200 performs control that provides an off-period Toff_all in which the switches SW1, SW2, SW6 and SW7 are off between the on-period Ton_SW1, 7 and the on-period Ton_SW2, 6.

In the second embodiment, an on-period Ton_SW7 of the seventh switch SW7, in which the charge of the third capacitor C3 is transferred, is synchronized with the on-period Ton_SW1 of the first switch SW1, in which the charge is accumulated in the first capacitor C1. Moreover, the on-period Ton_SW2 of the second switch SW2, in which the charge of the first capacitor C1 is transferred, is synchronized with an on-period Ton_SW6 of the sixth switch SW6, in which the charge is accumulated in the third capacitor C3.

In other words, in the second embodiment, accumulation and transfer of the charge are performed in parallel. Consequently, a charge transfer amount, namely, the output current Iout can be increased. For example, when the capacities of the first capacitor C1 and the third capacitor C3 are the same, the charge transfer amount can be doubled in the second embodiment, as compared to the first embodiment. In the configuration of FIG. 4, the charge transfer device 2 includes two signal paths. The present embodiment is not limited to such a configuration; for example, the charge transfer device 2 may include three or more signal paths. When the charge transfer device 2 includes three or more signal paths, the number of pairs of the switch and the capacitor connected in parallel may be three or more between the first node N1 and the second node N2. Moreover, on that occasion, a clock to each switch connected in parallel may be provided independently. This allows, for example, the charge transfer amount to be more than tripled, as compared to the first embodiment.

Modified Example

Figure 6:
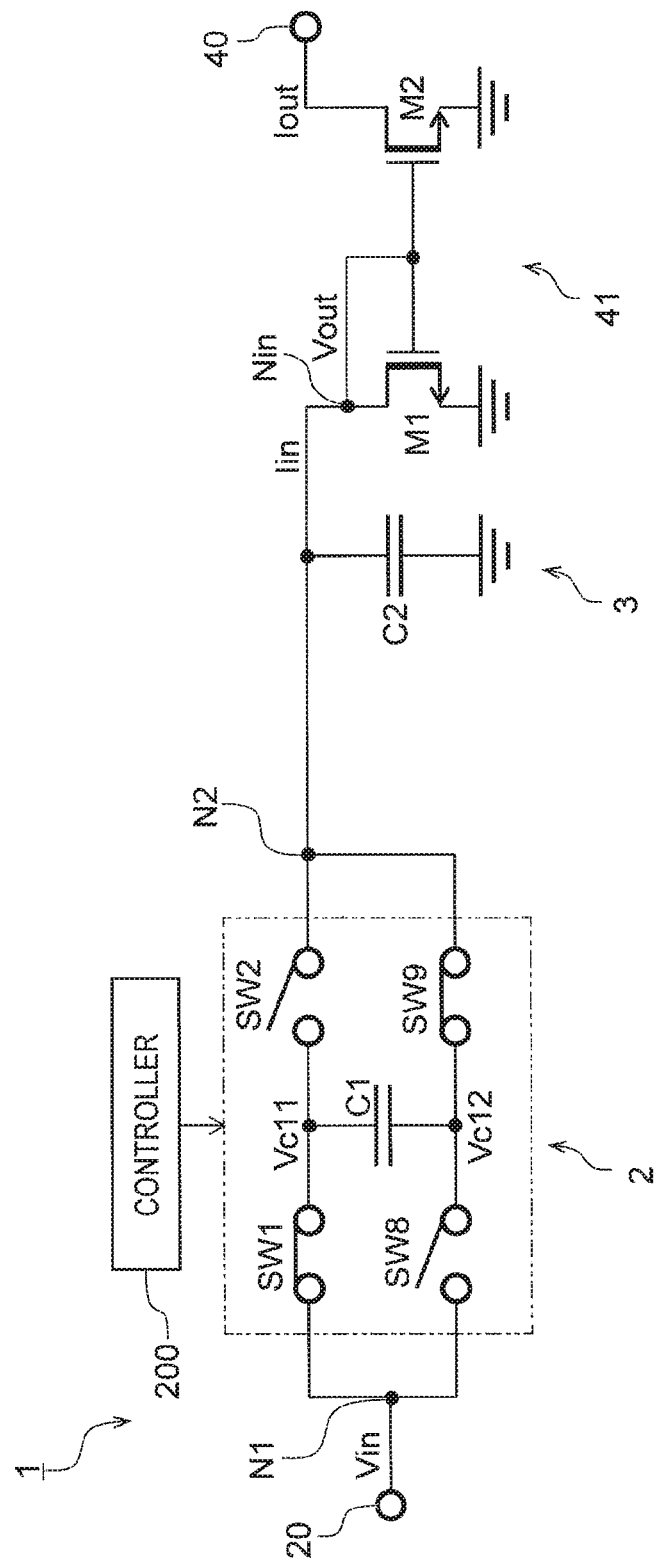
FIG. 6 is a circuit diagram showing a voltage to current converter of a modified example of the second embodiment.

Next, as a modified example of the second embodiment, an example in which the number of capacitors is reduced in a voltage to current converter including multiple signal paths will be described. Note that, in the modified example, configurations corresponding to those in the above-described embodiments are provided with same reference signs to omit redundant descriptions. FIG. 6 is a circuit diagram showing the voltage to current converter 1 of the modified example of the second embodiment. In addition to the configuration of the first embodiment, the voltage to current converter 1 in FIG. 6 further includes an eighth switch SW8 and a ninth switch SW9.

The eighth switch SW8 and the ninth switch SW9 are connected in parallel to the switches SW1 and SW2 between the first node N1 and the second node N2. The eighth switch SW8 is connected between the first node N1 and the other end of the first capacitor C1. The ninth switch SW9 is connected between the other end of the first capacitor C1 and the second node N2. In other words, since not being grounded, the first capacitor C1 in the modified example is a floating capacity.

Figure 7:
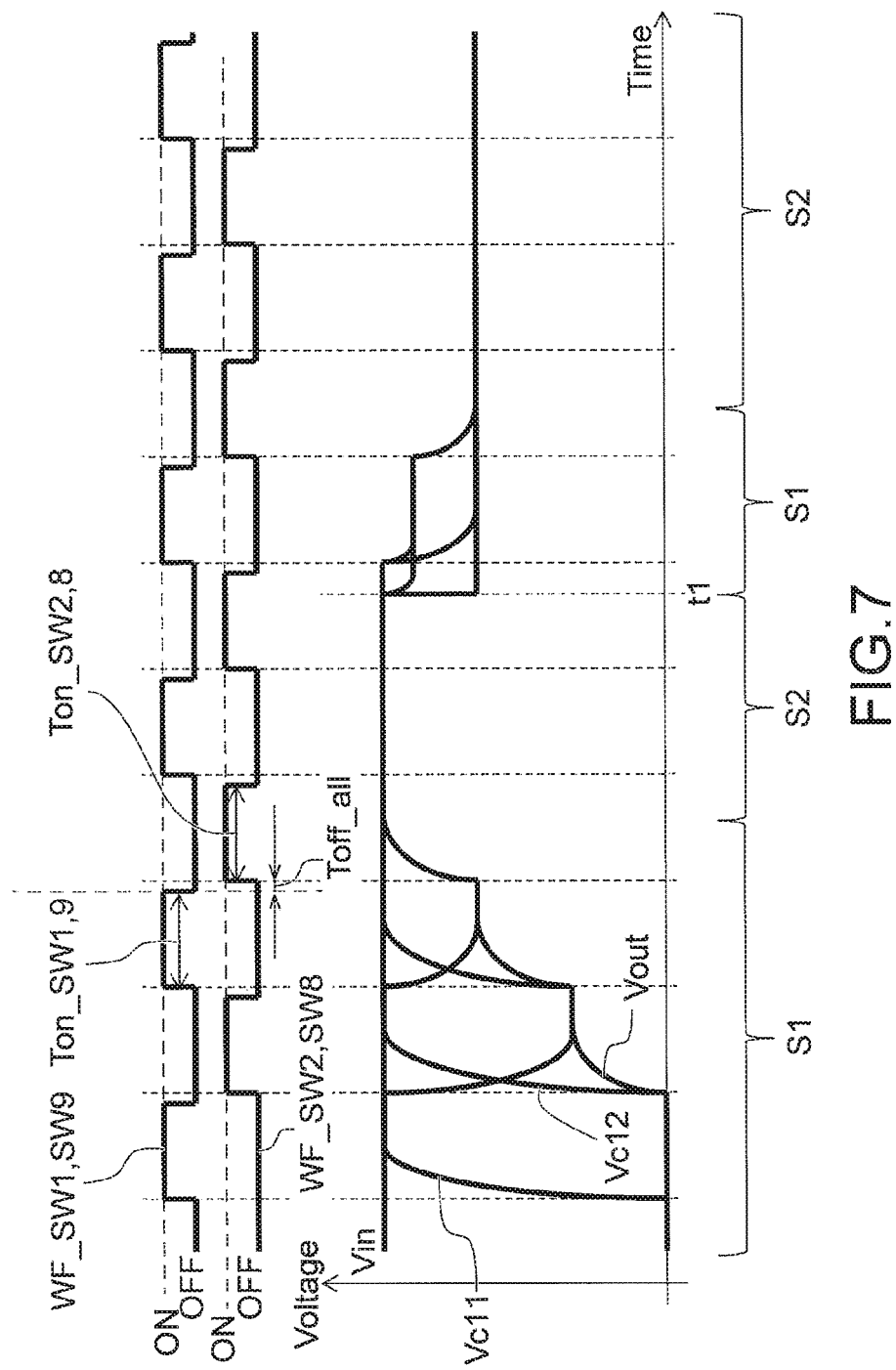
FIG. 7 is a waveform diagram showing an operation example of the voltage to current converter of the modified example of the second embodiment.

FIG. 7 is a waveform diagram showing an operation example of the voltage to current converter 1 of the modified example of the second embodiment. In FIG. 7, Vc11 is a potential of the one end of the first capacitor C1. Vc12 is a potential of the other end of the first capacitor C1.

As indicated by the waveforms WF_SW1, SW9 and WF_SW2, SW8 in FIG. 7, the controller 200 performs control that synchronizes the first switch SW1 and the ninth switch SW9, synchronizes the second switch SW2 and the eighth switch SW8, and turns on or off.

Moreover, the controller 200 performs control that turns off the switches SW2 and SW8 during an on-period Ton_SW1, 9 in which the switches SW1 and SW9 are on. Moreover, the controller 200 performs control that turns off the switches SW1 and SW9 during an on-period Ton_SW2, 8 in which the switches SW2 and SW8 are on.

Moreover, the controller 200 performs control that provides an off-period Toff_all in which the switches SW1, SW2, SW8 and SW9 are off between the on-period Ton_SW1, 9 and the on-period Ton_SW2, 8. In the modified example, also, accumulation and transfer of the charge are performed in parallel.

Moreover, as shown in FIG. 7, in the modified example, the input voltage Vin is reduced at the time point t1 by controlling a power supply. By switch control like this, in the modified example, the transient state S1 and the steady state S2 are generated alternately. The output voltage Vout in the steady state S2 coincides with the input voltage Vin. When the input voltage Vin is reduced at the time point t1, the output voltage Vout is changed to the transient state S1, and thereafter, falls to Vin after the reduction to be in a new steady state S2. Note that the voltage to current converter 1 of the modified example constitutes a non-inverting amplifier. Consequently, though not shown in the figure, the larger the input voltage Vin is, the larger the output current Iout is.

According to the modified example, similar to the configuration in FIG. 4, the charge transfer amount can be increased. Moreover, the voltage to current converter 1 in FIG. 6 does not include the third capacitor C3. Consequently, according to the modified example, it is possible to reduce the number of parts while increasing the charge transfer amount.

Third Embodiment

Figure 8:
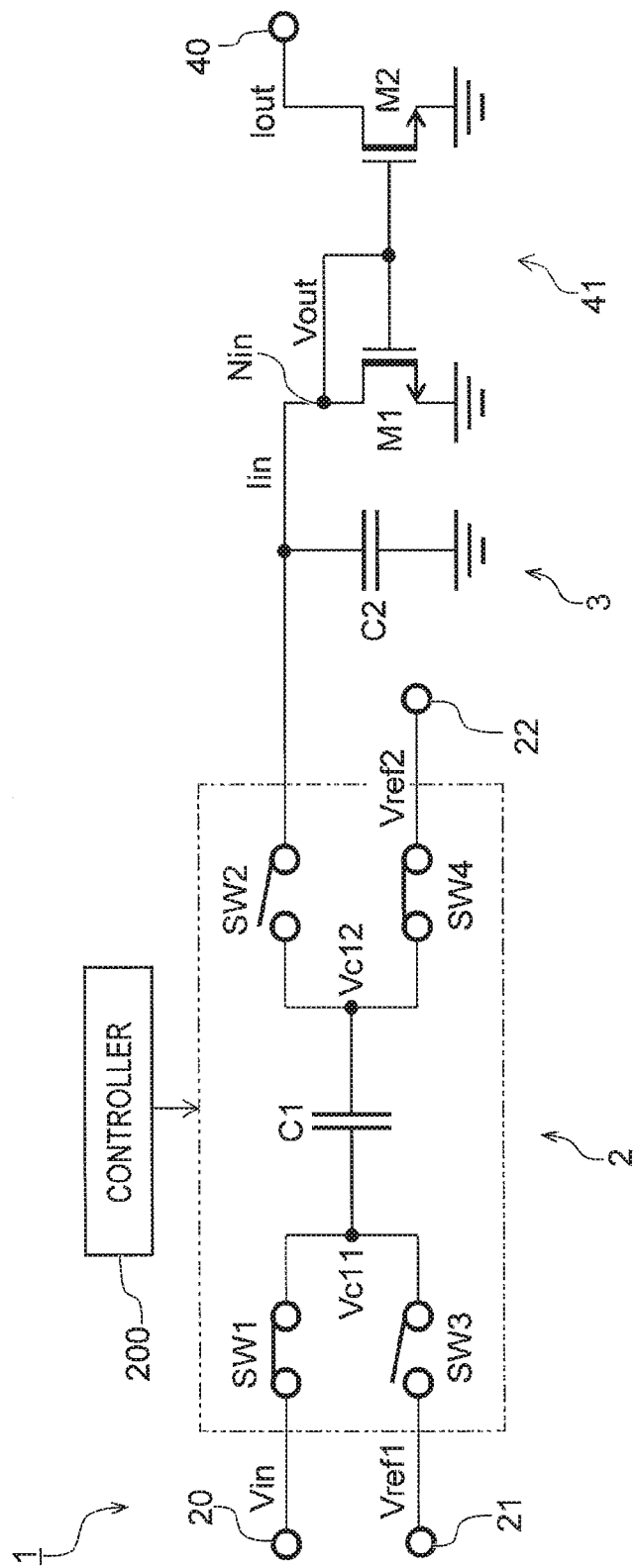
FIG. 8 is a circuit diagram showing a voltage to current converter of a third embodiment.

Next, as a third embodiment, a voltage to current converter performing temperature compensation by use of a reference voltage will be described. Note that, in the third embodiment, configurations corresponding to those in the above-described embodiments are provided with same reference signs to omit redundant descriptions. FIG. 8 is a circuit diagram showing a voltage to current converter 1 of the third embodiment. In the voltage to current converter 1 in FIG. 8, as against the first embodiment, the connection state between the first capacitor C1 and the switches SW1, SW2 is different. Moreover, in addition to the configuration of the first embodiment, the voltage to current converter 1 in FIG. 8 includes a third switch SW3 and a fourth switch SW4.

The third switch SW3 switches whether or not charge corresponding to a first reference voltage Vref1 is accumulated in the first capacitor C1. The fourth switch SW4 switches whether or not charge corresponding to a second reference voltage Vref2 is accumulated in the first capacitor C1. The first and second reference potentials Vref1 and Vref2 are voltages based on the temperature characteristics of the current generator 4. Note that the reference voltages Vref1 and Vref2 may have temperature characteristics such that, for example, values thereof decrease with a rise in temperature. Moreover, the second reference voltage Vref2 may be a voltage different from the first reference voltage Vref1.

The first switch SW1 is connected between the input terminal 20 and the one end of the first capacitor C1. The second switch SW2 is connected between the other end of the first capacitor C1 and the current input node Nin.

The third switch SW3 is connected between an input terminal 21 of the first reference voltage Vref1 and the one end of the first capacitor C1. The fourth switch SW4 is connected between the other end of the first capacitor C1 and an input terminal 22 of the second reference voltage Vref2. The input terminals 21 and 22 are external input terminals.

The current mirror circuit 41 has temperature characteristics such that threshold voltages Vth of the first MOS transistor M1 and the second MOS transistor M2 vary in response to changes in temperature. To keep the value of the output current Iout constant regardless of the changes in temperature, it is desirable to adjust the gate input, namely, the output voltage Vout in response to the changes in temperature.

For adjusting the output voltage Vout in response to the changes in temperature, the first capacitor C1 inputs the first reference voltage Vref1 based on the temperature characteristics of the current mirror circuit 41 to the input terminal 21. Alternatively, the first capacitor C1 inputs the second reference voltage Vref2 based on the temperature characteristics of the current mirror circuit 41 to the input terminal 22.

Figures 9A, 9B:
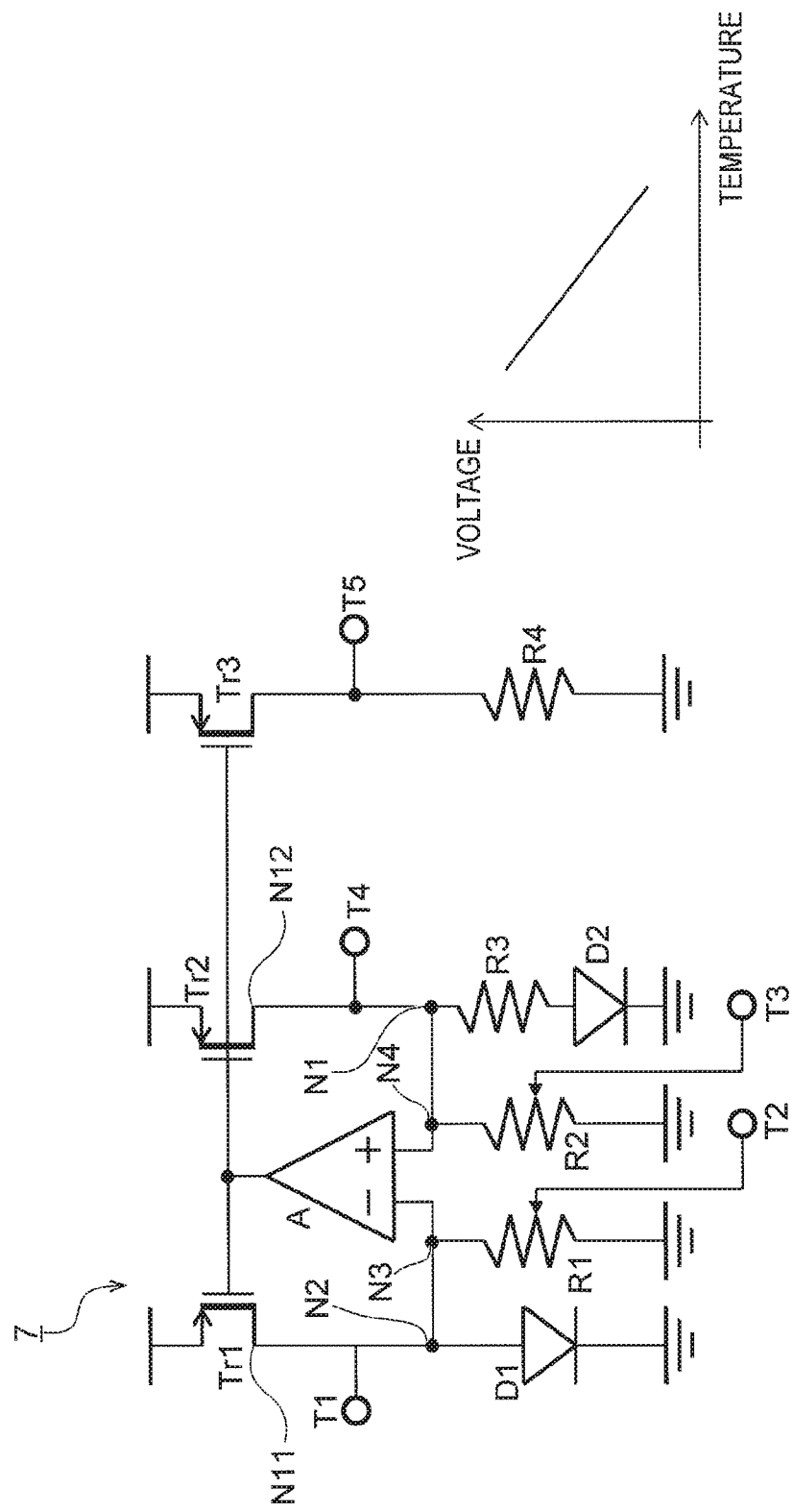
FIG. 9A is a circuit diagram showing a bias circuit applicable to the voltage to current converter of the third embodiment.
FIG. 9B is a graph showing temperature characteristics of a reference voltage obtained by the bias circuit in FIG. 9A.

FIG. 9A is a circuit diagram of a bias circuit 7 applicable to the voltage to current converter 1 of the third embodiment. The first reference voltage Vref1 and the second reference voltage Vref2 can be generated by, for example, the bias circuit 7 in FIG. 9A, namely, a bandgap reference circuit. The bias circuit 7 may constitute a voltage-to-current conversion system together with the voltage to current converter 1.

The bias circuit 7 includes p-type first to third MOS transistors Tr1 to Tr3, an operational amplifier A, first and second diodes D1 and D2, first to fourth resistances R1 to R4 and first to fifth output terminals T1 to T5. The first and second resistances R1 and R2 are variable resistances.

The MOS transistors Tr1 to Tr3 are connected in parallel between a power supply potential and a ground potential and gated together.

The first diode D1 is connected in a forward direction between a drain of the first MOS transistor Tr1 (a node N11) and the ground potential. The first resistance R1 is connected between the node N11 and the ground potential. In other words, the first diode D1 and the first resistance R1 are connected in parallel between the node N11 and the ground potential.

The second resistance R2 is connected between a drain of the second MOS transistor Tr2 (a node N12) and the ground potential. Moreover, one end of the third resistance R3 is connected to the node N12. The second diode D2 is connected in the forward direction between the other end of the third resistance R3 and the ground potential. The fourth resistance R4 is connected between the drain of the third MOS transistor Tr3 and the ground potential.

An output terminal of the operational amplifier A is connected to the common gate of the MOS transistors Tr1 to Tr3. A non-inverting input terminal of the operational amplifier A is connected to the node N12. An inverting input terminal of the operational amplifier A is connected to the node N11.

The first output terminal T1 is connected to the node N11. The second output terminal T2 is connected to a moving contact of the first resistance R1. The third output terminal T3 is connected to a moving contact of the second resistance R2. The fourth output terminal T4 is connected to the node N12. The fifth output terminal T5 is connected to the drain of the third MOS transistor Tr3.

Any two of the output terminals T1 to T5 are connected to the input terminal 21 or the input terminal 22. The connection of the output terminals T1 to T5 and the input terminals 21 and 22 may be selectively performed by a switch (not shown in the figure) provided between the bias circuit 7 and the charge transfer device 2.

In the bias circuit 7, an output signal of the operational amplifier A is fed back as an input to make the potential of the non-inverting input terminal and the potential of the inverting input terminal equal. In the process, a reference voltage is generated by a voltage drop in the first diode D1 between the first output terminal T1 and the ground potential. Moreover, between the second output terminal T2 and the ground potential, of the voltage corresponding to the voltage drop in the first resistance R1, a reference voltage corresponding to a partial voltage at the moving contact is generated. Moreover, between the third output terminal T3 and the ground potential, of the voltage corresponding to the voltage drop in the second resistance R2, a reference voltage corresponding to a partial voltage at the moving contact is generated. Moreover, between the fourth output terminal T4 and the ground potential, a reference voltage by a voltage drop in the third resistance R3 and the second diode D2 is generated. Moreover, between the fifth output terminal T5 and the ground potential, a reference voltage by a voltage drop in the fourth resistance R4 is generated.

FIG. 9B is a graph showing temperature characteristics of a reference voltage obtained by the bias circuit 7 in FIG. 9A. In FIG. 9B, characteristics of the reference voltage generated in each of the output terminals T1 to T5 are representatively shown. The reference voltage obtained in the bias circuit 7 has temperature characteristics that linearly vary with changes in temperature. This is because the reference voltage is generated based on the current in the MOS transistors Tr1 to Tr3 in which the threshold voltage Vth has the temperature characteristics. Note that the slop of the temperature characteristics of the fifth output terminal T5 can be arbitrarily changed to positive, negative or 0 by the number of resistances, capacitors and diodes connected in parallel.

By inputting such a reference voltage to the first capacitor C1, it is possible to adjust the output voltage Vout to make the output current Iout constant regardless of the changes in temperature, namely, to perform temperature compensation. Moreover, these reference voltages may be, for example, connected in place of a grounding part to the first and second capacitors C1 and C2 in the first embodiment, or may be connected in place of a grounding part to the first to third capacitors C1 to C3 in the second embodiment.

Figure 10:
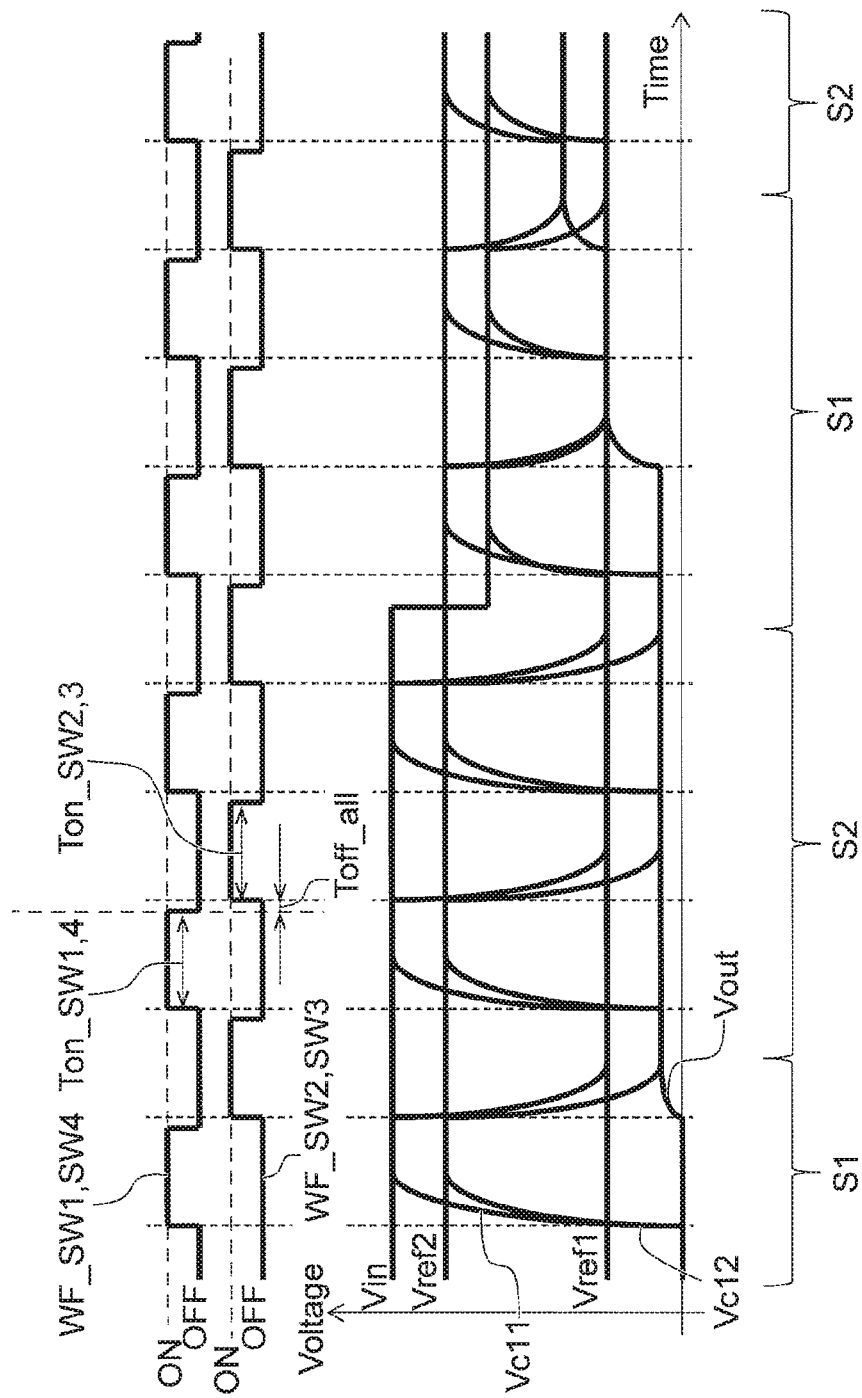
FIG. 10 is a waveform diagram showing an operation example of the voltage to current converter of the third embodiment.

FIG. 10 is a waveform diagram showing an operation example of the voltage to current converter 1 of the third embodiment. As indicated by the waveforms WF_SW1, SW4 and WF_SW2, SW3 in FIG. 10, the controller 200 performs control that synchronizes the switches SW1 and SW4, synchronizes the switches SW2 and SW3, and turns on or off.

Moreover, the controller 200 performs control that turns off the switches SW2 and SW3 during an on-period Ton_SW1, 4 of the switches SW1 and SW4. Moreover, the controller 200 performs control that turns off the switches SW1 and SW4 during an on-period Ton_SW2, 3 of the switches SW2 and SW3. Moreover, the controller 200 performs control that provides an off-period Toff_all in which the switches SW1 to SW4 are off between the on-period Ton_SW1, 4 and the on-period Ton_SW2, 3.

By such switching control, the potentials Vc11 and Vc12 of the both ends of the first capacitor C1 transit to make the difference between thereof constant. Specifically, Vc11 repeats a change to the input potential Vin during the on-period Ton_SW1, 4 and a change to the first reference potential Vref1 during the on-period Ton_SW2, 3. Moreover, Vc12 repeats a change to the second reference potential Vref2 during the on-period Ton_SW1, 4 and a change to the output potential Vout during the on-period Ton_SW2, 3. Note that, in the example in FIG. 10, the value of the second reference voltage Vref2 is higher than the value of the first reference voltage Vref1.

Consequently, the output voltage Vout repeats the transient state S1 and the steady state S2. Moreover, the output voltage Vout increases with the decrease of the input voltage Vin.

In the third embodiment, for example, during the on-period Ton_SW1, 4, it is possible to apply a voltage corresponding to the difference between the input voltage Vin and the second reference voltage Vref2 to the first capacitor C1.

For example, when the second reference voltage Vref2 has temperature characteristics to increase with the rise in temperature, the higher the temperature is, the smaller the difference between the input voltage Vin and the second reference voltage Vref2 becomes. In other words, the higher the temperature is, the smaller voltage is applied to the first capacitor C1. Since the voltage applied to the first capacitor C1 is small, the higher the temperature is, the smaller the output voltage Vout, namely, the gate input of the MOS transistors M1 and M2 becomes. The MOS transistors M1 and M2 have the temperature characteristics such that the threshold voltage Vth becomes smaller as the temperature is higher. Therefore, by inputting the gate voltage that becomes smaller as the temperature is higher, the MOS transistors M1 and M2 are able to pass a constant current regardless of changes in temperature.

Consequently, according to the third embodiment, by performing the temperature compensation using the reference voltage, it is possible to obtain a constant output current Iout regardless of changes in temperature. Note that the voltage to current converter 1 of the third embodiment constitutes an inverting amplifier. Consequently, though not shown in the figure, the larger the input voltage Vin is, the smaller the output current Iout becomes.

Modified Example

Figure 11:
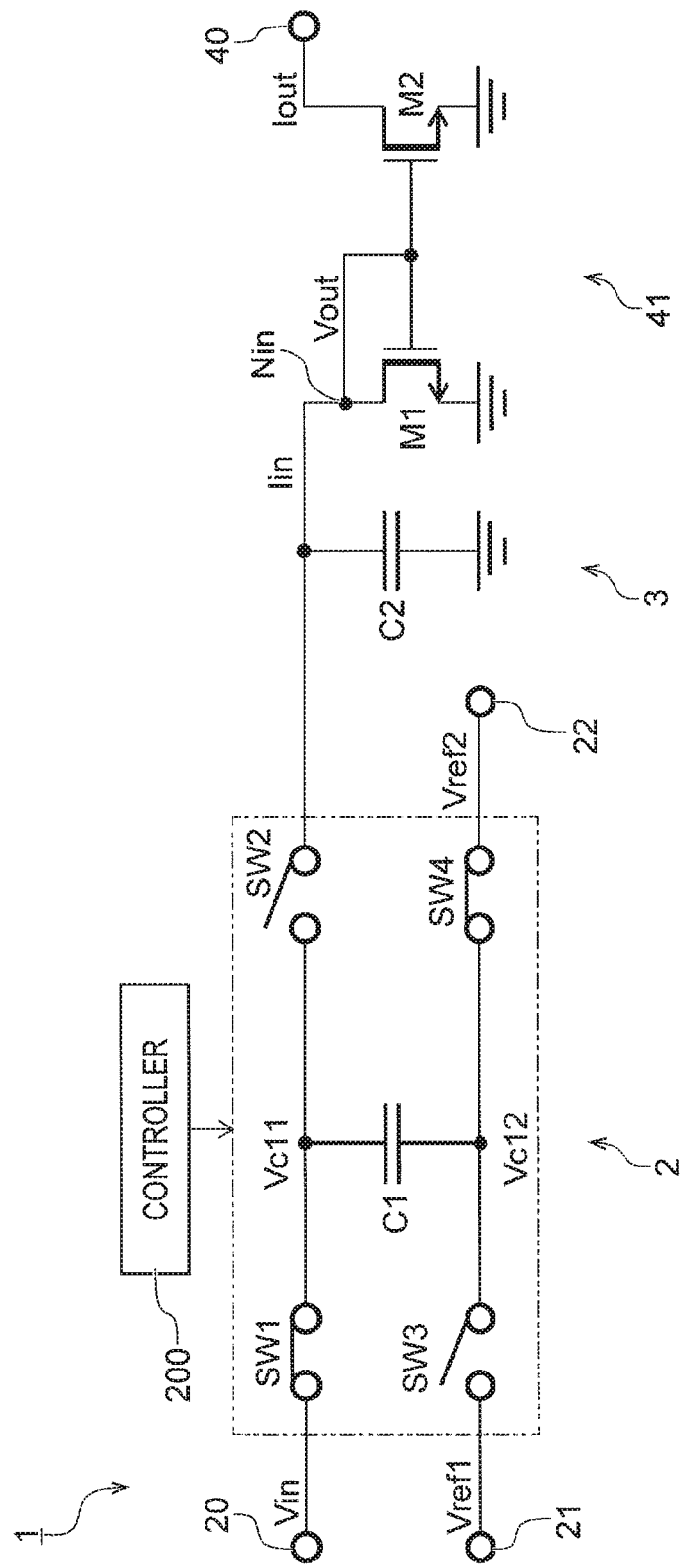
FIG. 11 is a circuit diagram showing a voltage to current converter of a modified example of the third embodiment.

Next, as a modified example of the third embodiment, an example in which the connection state of the first capacitor C1 is changed from the configuration in FIG. 8 will be described. Note that, in the modified example, configurations corresponding to those in the above-described embodiments are provided with same reference signs to omit redundant descriptions. FIG. 11 is a circuit diagram showing the voltage to current converter 1 of the modified example of the third embodiment.

In the modified example, the first switch SW1 is connected between the input terminal 20 and one end of the first capacitor C1. The second switch SW2 is connected between the one end of the first capacitor C1 and the current input node Nin. The third switch SW3 is connected between the input terminal 21 and one end of the first capacitor C1. The fourth switch SW4 is connected between the other end of the first capacitor C1 and the input terminal 22.

Figure 12:
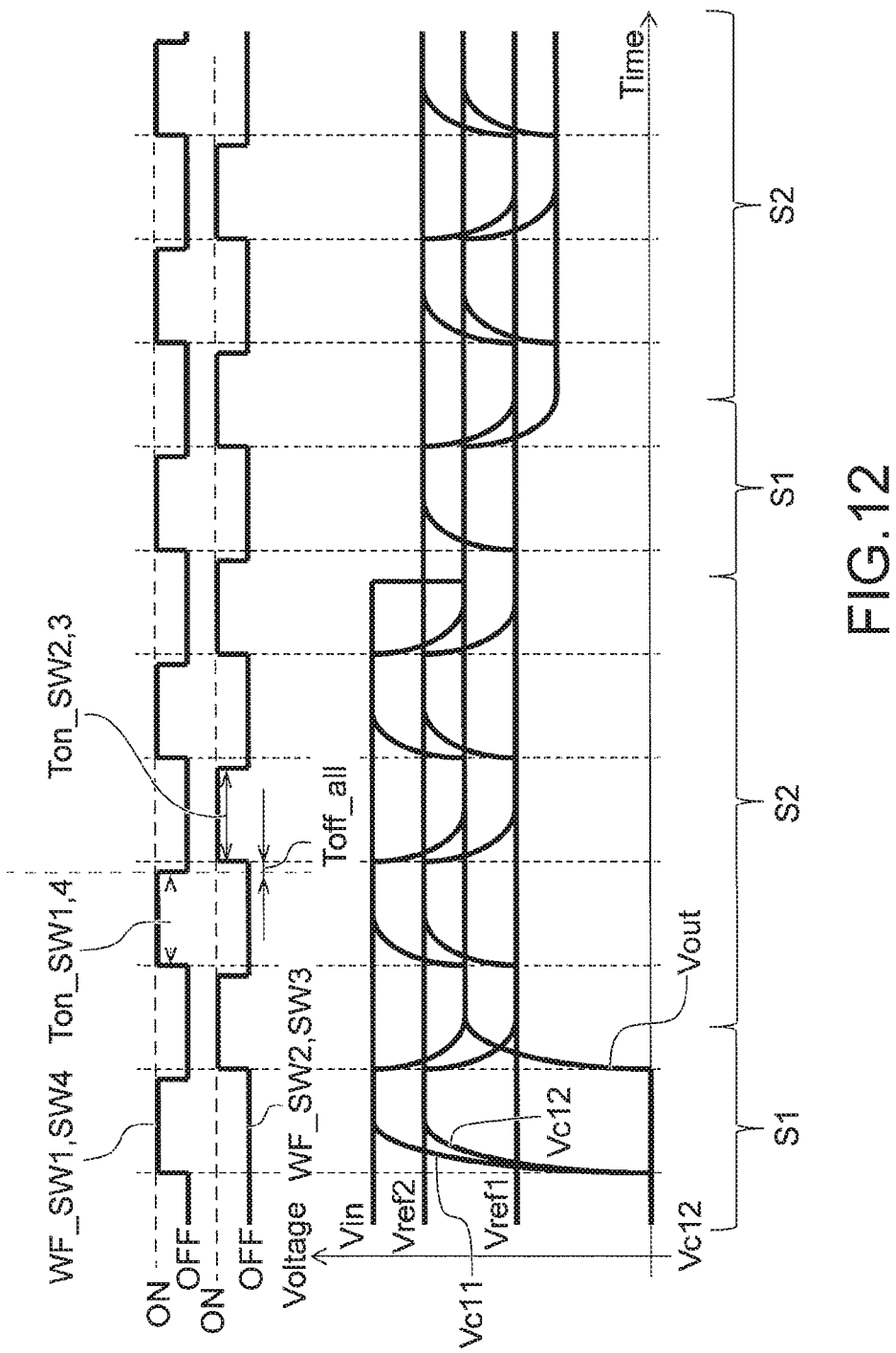
FIG. 12 is a waveform diagram showing an operation example of the voltage to current converter in the modified example of the third embodiment.

FIG. 12 is a waveform diagram showing an operation example of the voltage to current converter 1 of the modified example of the third embodiment. As indicated by the waveforms WF_SW1, SW4 and WF_SW2, SW3 in FIG. 12, the controller 200 performs control that synchronizes the switches SW1 and SW4, synchronizes the switches SW2 and SW3, and turns on or off. Moreover, the controller 200 performs control that turns off the switches SW2 and SW3 during an on-period Ton_SW1, 4 of the switches SW1 and SW4. Moreover, the controller 200 performs control that turns off the switches SW1 and SW4 during an on-period Ton_SW2, 3 of the switches SW2 and SW3. Moreover, the controller 200 performs control that provides an off-period Toff_all in which the switches SW1 to SW4 are off between the on-period Ton_SW1, 4 and the on-period Ton_SW2, 3.

By such switching control, the potentials Vc11 and Vc12 of the both ends of the first capacitor C1 transit to make the difference between thereof constant. Specifically, Vc11 repeats a change to the input potential Vin during the on-period Ton_SW1, 4 and a change to the output potential Vout during the on-period Ton_SW2, 3. Moreover, Vc12 repeats a change to the second reference potential Vref2 during the on-period Ton_SW1, 4 and a change to the first reference potential Vref1 during the on-period Ton_SW1, 4.

Consequently, the output voltage Vout repeats the transient state S1 and the steady state S2. Moreover, the output voltage Vout decreases with the decrease of the input voltage Vin. In the modified example, also, by performing the temperature compensation using the reference voltage, it is possible to obtain a constant output current Iout regardless of changes in temperature.

Fourth Embodiment

Figure 13:
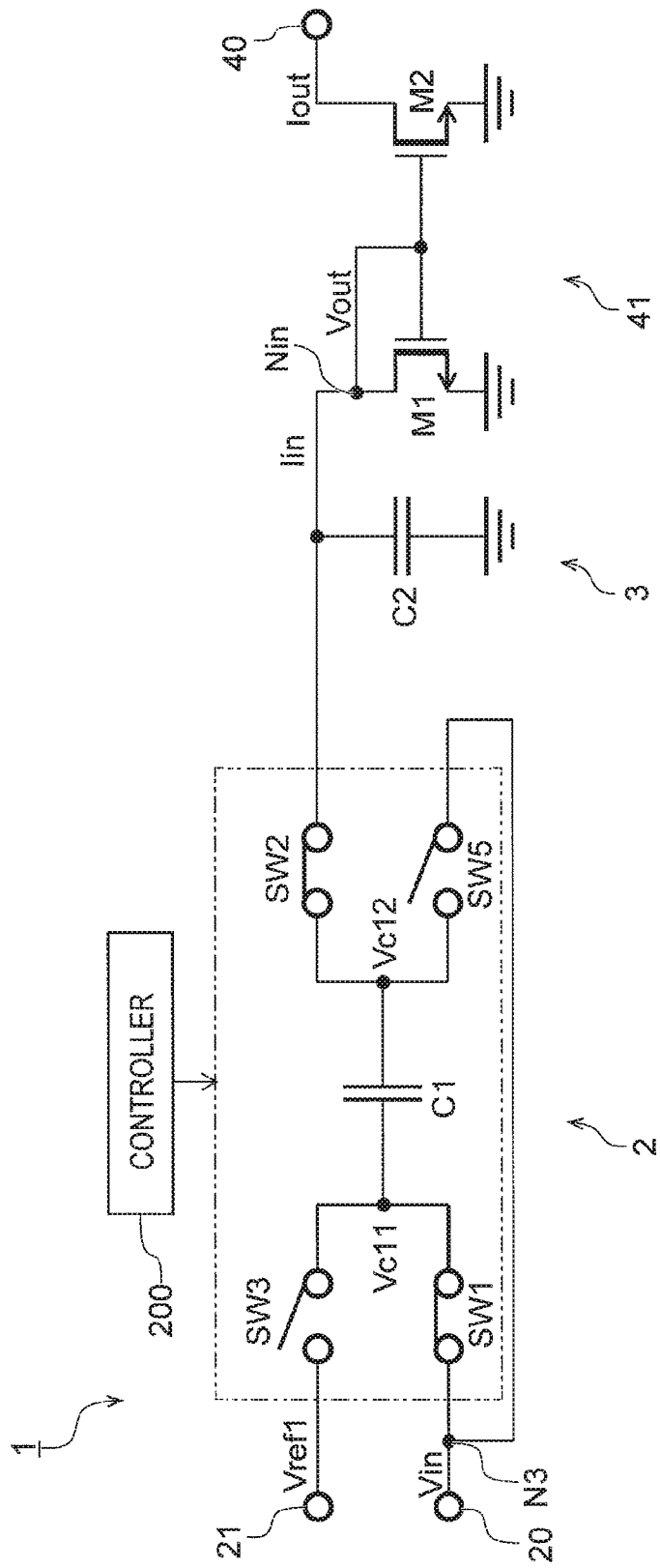
FIG. 13 is a circuit diagram showing a voltage to current converter of a fourth embodiment.

Next, as a fourth embodiment, an embodiment that divides the input of the power supply voltage into two locations will be described. Note that, in the fourth embodiment, configurations corresponding to those in the above-described embodiments are provided with same reference signs to omit redundant descriptions. FIG. 13 is a circuit diagram showing the voltage to current converter 1 of the fourth embodiment. In FIG. 13, one other end of a fifth switch SW5 is connected to the input terminal 20, and the input voltage Vin is applied. Moreover, with the configuration, control of the switch by the controller 200 differs.

Figure 14:
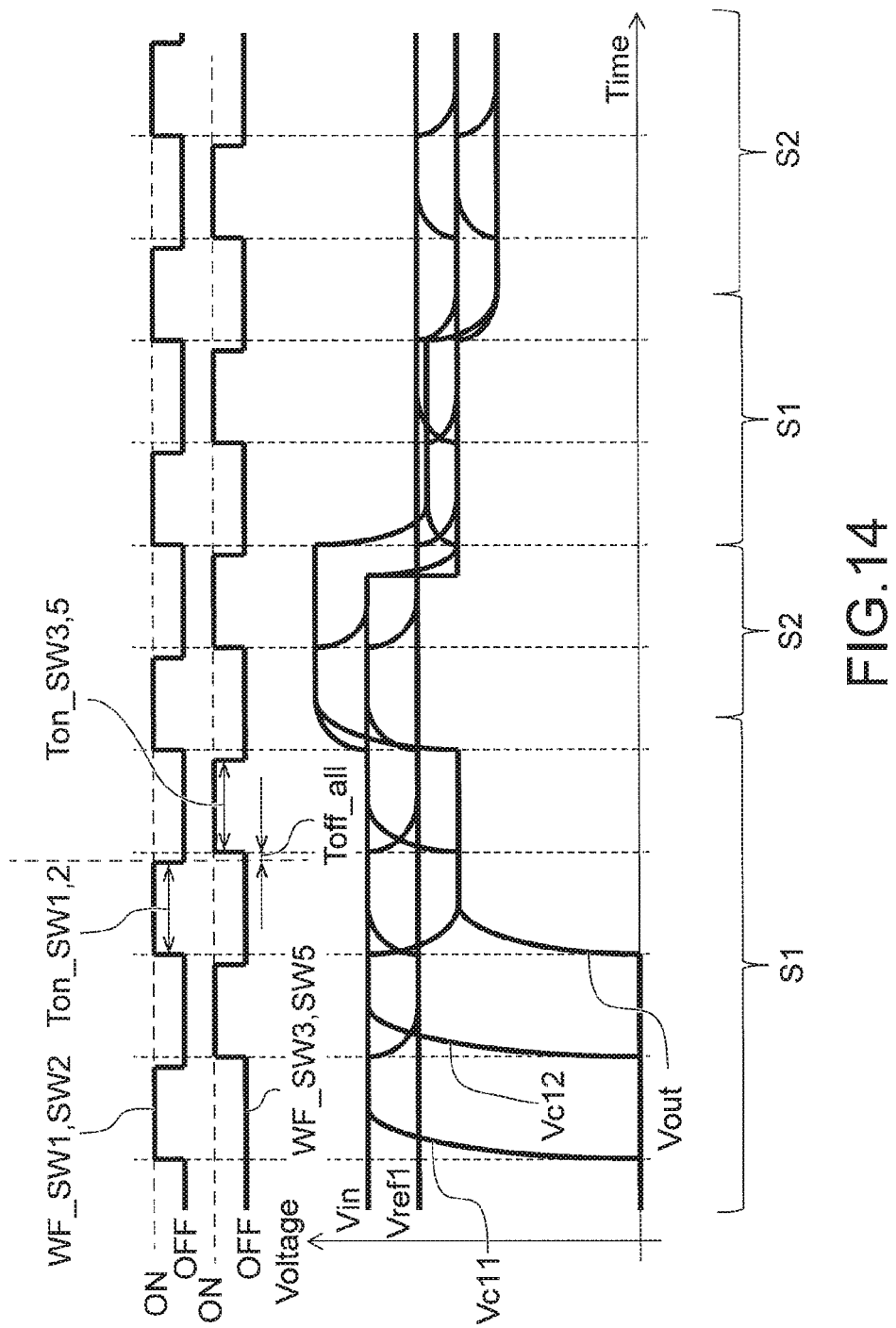
FIG. 14 is a waveform diagram showing an operation example of the voltage to current converter of the fourth embodiment.

FIG. 14 is a waveform diagram showing an operation example of the voltage to current converter 1 of the fourth embodiment. As indicated by the waveforms WF_SW1, SW2 and WF_SW3, SW5 in FIG. 14, the controller 200 performs control that synchronizes the first switch SW1 and the second switch SW2, synchronizes the third switch SW3 and the fifth switch SW5, and turns on or off. Moreover, the controller 200 performs control that turns off the switches SW3 and SW5 during an on-period Ton_SW1, 2 of the switches SW1 and SW2. Moreover, the controller 200 performs control that turns off the switches SW1 and SW2 during an on-period Ton_SW3, 5 of the switches SW3 and SW5. Moreover, the controller 200 performs control that provides an off-period Toff_all in which the switches SW1 to SW3 and SW5 are off between the on-period Ton_SW1, 2 and the on-period Ton_SW3, 5.

By such switching control, the potentials Vc11 and Vc12 of the both ends of the first capacitor C1 transit to make the difference between thereof constant. Specifically, Vc11 repeats a change to the input potential Vin during the on-period Ton_SW1, 2 and a change to the first reference potential Vref1 during the on-period Ton_SW3, 5. Moreover, Vc12 repeats a change to the input potential Vin during the on-period Ton_SW3, 5 and a change to the output potential Vout during the on-period Ton_SW1, 2.

Consequently, the output voltage Vout repeats the transient state S1 and the steady state S2. Moreover, the output voltage Vout decreases with the decrease of the input voltage Vin. In the fourth embodiment, also, by performing the temperature compensation using the first reference voltage Vref1, it is possible to obtain a constant output current Iout regardless of changes in temperature.

Moreover, in the fourth embodiment, an on-period Ton_SW2 of the second switch SW2, in which the charge of the first capacitor C1 is transferred, is synchronized with the on-period Ton_SW1 of the first switch SW1, in which the charge is accumulated in the first capacitor C1. Consequently, it is possible to perform accumulation and transfer of the charge in parallel.

Therefore, according to the fourth embodiment, it is possible to mitigate temperature dependency of the output current Iout by performing the temperature compensation, and it is possible to increase the charge transfer amount by synchronizing accumulation and transfer of charge.

Modified Example

Figure 15:
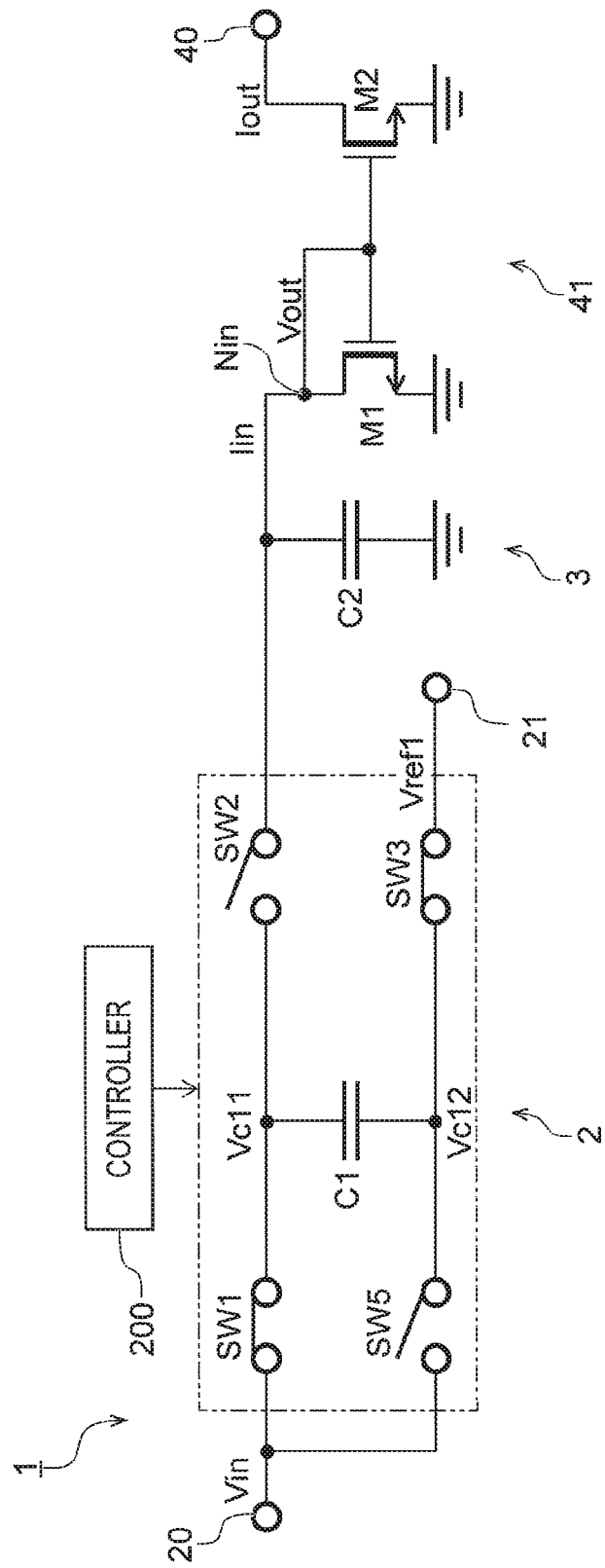
FIG. 15 is a circuit diagram showing a voltage to current converter of a modified example of the fourth embodiment.

Next, as a modified example of the fourth embodiment, an example in which the connection state of the first capacitor C1, the third switch SW3 and the fifth switch SW5 is changed from the configuration in FIG. 13 will be described. Note that, in the modified example, configurations corresponding to those in the above-described embodiments are provided with same reference signs to omit redundant descriptions. FIG. 15 is a circuit diagram showing the voltage to current converter 1 of the modified example of the fourth embodiment. In the modified example, the fifth switch SW5 is connected between the input terminal 20 and the other end of the first capacitor C1.

Figure 16:
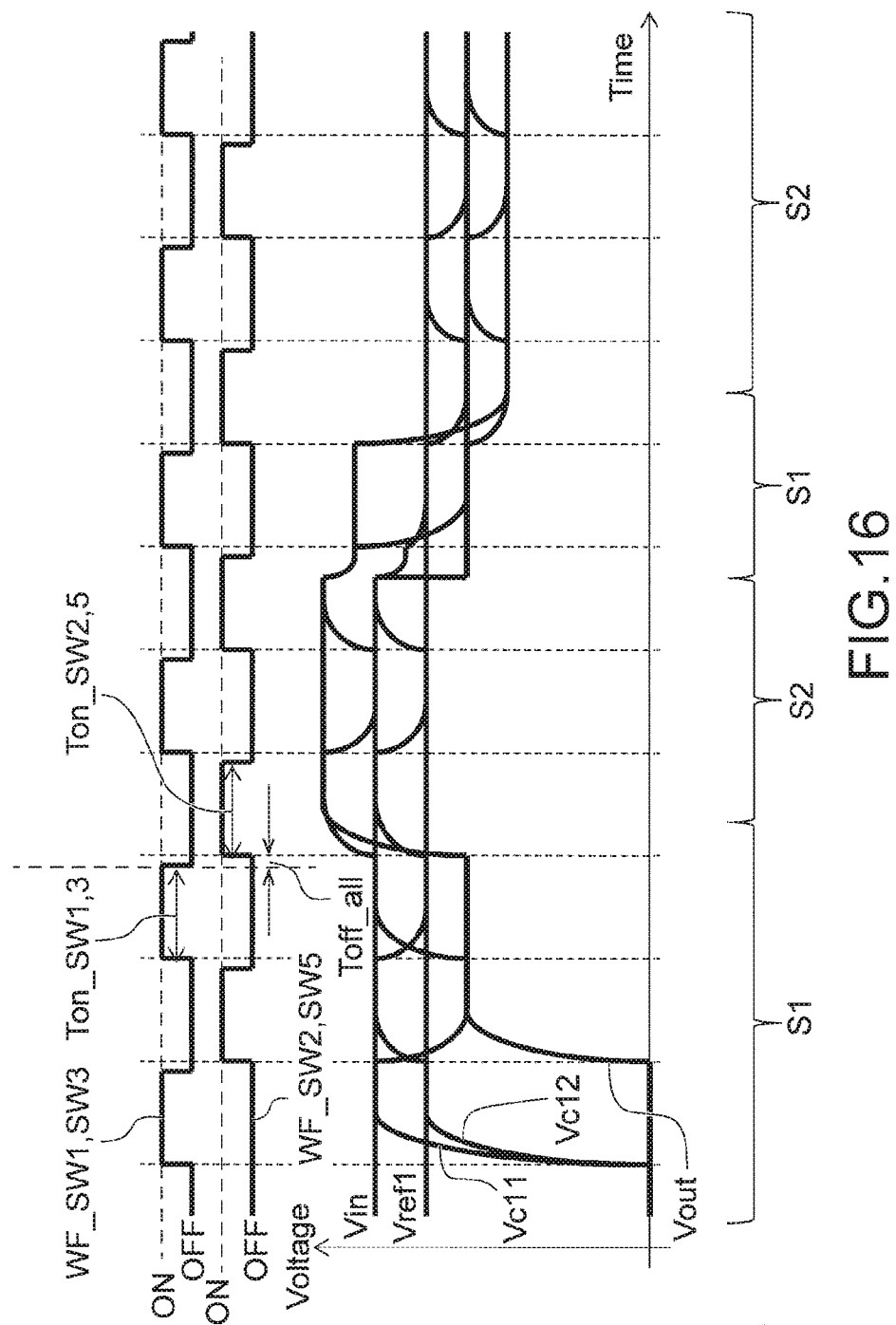
FIG. 16 is a waveform diagram showing an operation example of the voltage to current converter in the modified example of the fourth embodiment.

FIG. 16 is a waveform diagram showing an operation example of the voltage to current converter 1 in the modified example of the fourth embodiment. As indicated by the waveforms WF_SW1, SW3 and WF_SW2, SW5 in FIG. 16, the controller 200 performs control that synchronizes the first switch SW1 and the third switch SW3, synchronizes the second switch SW2 and the fifth switch SW5, and turns on or off. Moreover, the controller 200 performs control that turns off the switches SW2 and SW5 during an on-period Ton_SW1, 3 of the switches SW1 and SW3. Moreover, the controller 200 performs control that turns off the switches SW1 and SW3 during an on-period Ton_SW2, 5 of the switches SW2 and SW5. Moreover, the controller 200 performs control that provides the off-period Toff_all in which the switches SW1 to SW3 and SW5 are off between the on-period Ton_SW1, 3 and the on-period Ton_SW2, 5.

By such switching control, the potentials Vc11 and Vc12 of the both ends of the first capacitor C1 transit to make the difference between thereof constant. Specifically, Vc11 repeats a change to the input potential Vin during the on-period Ton_SW1, 3 and a change to the output potential Vout during the on-period Ton_SW2, 5. Moreover, Vc12 repeats a change to the input potential Vin during the on-period Ton_SW2, 5 and a change to the first reference potential Vref1 during the on-period Ton_SW1, 3.

Consequently, the output voltage Vout repeats the transient state S1 and the steady state S2. Moreover, the output voltage Vout decreases with the decrease of the input voltage Vin.

In the modified example, also, by performing the temperature compensation using the first reference voltage Vref1, it is possible to obtain a constant output current Iout regardless of changes in temperature.

Fifth Embodiment

Figure 17:
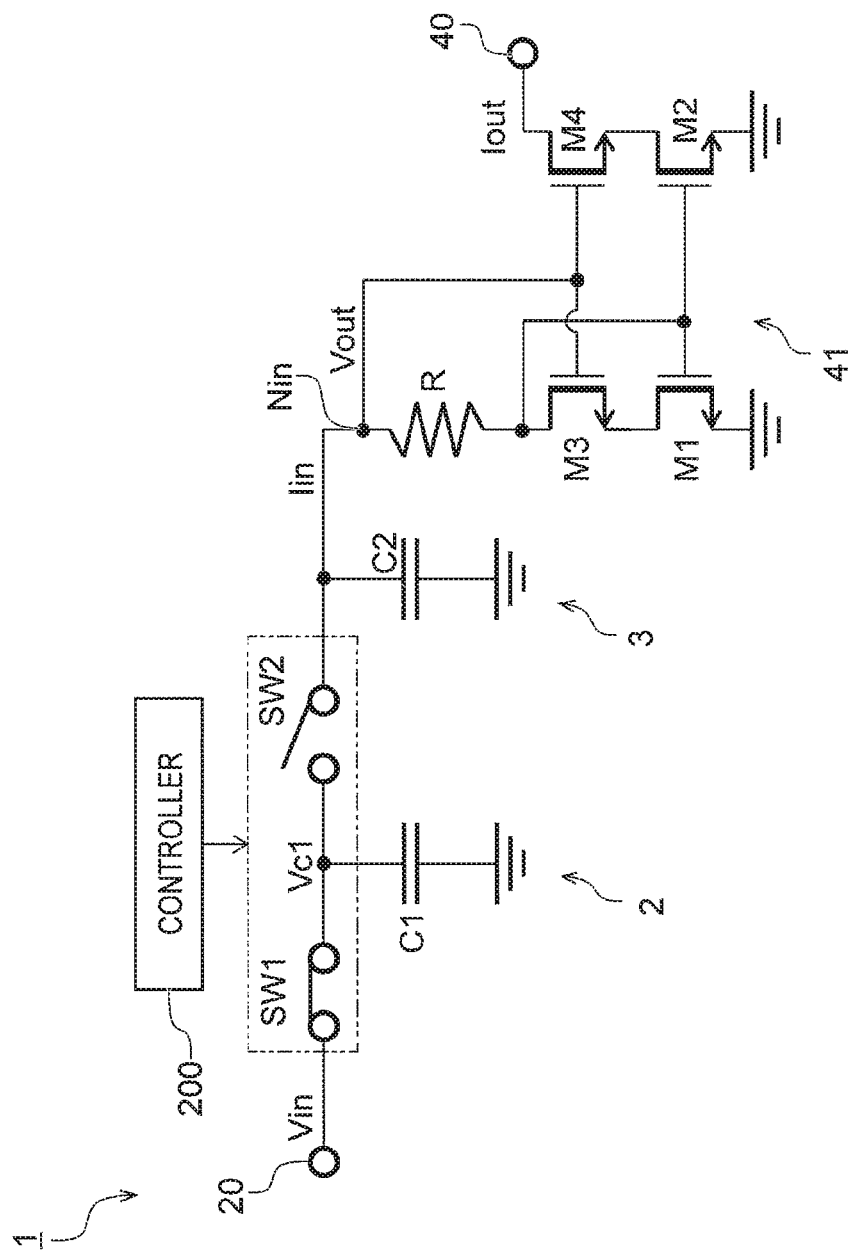
FIG. 17 is a circuit diagram showing a voltage to current converter of a fifth embodiment.

Next, as a fifth embodiment, an embodiment in which the current generator 4 includes a cascode current mirror will be described. FIG. 17 is a circuit diagram showing a voltage to current converter 1 of the fifth embodiment.

The current generator 41 in FIG. 17 is a cascode current mirror. Specifically, in addition to the configuration of the current mirror circuit 41 in FIG. 2, the current generator 41 further includes an n-type third MOS transistor M3 that is diode-connected, an n-type fourth MOS transistor M4 that is gated in common with the third MOS transistor M3 and a resistance R. The resistance R is provided for securing a drain-to-source voltage necessary to operate the first MOS transistor M1 in the saturation region.

The third MOS transistor M3 is connected in series to a drain side of the first MOS transistor M1. The resistance R is connected between the current input node Nin and a drain of the third MOS transistor M3. The common gate of the first MOS transistor M1 and the second MOS transistor M2 is connected between the resistance R and the third MOS transistor M3. The fourth MOS transistor M4 is connected in series to a drain side of the second MOS transistor M2.

According to the fifth embodiment, by use of the cascode current mirror, it is possible to make the drain-to-source voltages of the first and second MOS transistors M1 and M2 equal.

Consequently, as compared to the first embodiment, the output current Iout, which is a more exact copy of the input current Iin, can be obtained.

Note that, in FIG. 17, the configurations of the charge transfer device 2 and the smoother 3 are the same as those of the first embodiment. The current mirror circuit 41 in FIG. 17 may be combined with any of the charge transfer devices 2 in the second to fourth embodiments.

It may be possible to appropriately combine the charge transfer device 2, the smoother 3 and the current generator 4 shown in the first to fifth embodiments. Moreover, when the input voltage Vin is weak, a buffer may be provided prior to the charge transfer device 2 to amplify the voltage Vin.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A voltage to current converter comprising:
   a charge transfer device that accumulates charge corresponding to an input voltage and transfers the accumulated charge, the charge transfer device comprising a first capacitor;
   a smoother that accumulates the transferred charge and smooths an output voltage; and
   a current generator that generates a current corresponding to the input voltage by use of a current corresponding to the charge accumulated in the smoother, wherein
   the current generator comprises:
   a first transistor which is diode-connected and one end of which is directly connected to the smoother; and
   a second transistor which is gated in common with the first transistor, the second transistor outputting the current proportional to a value obtained by dividing a product of a transconductance of the second transistor, a capacity of the first capacitor and the input voltage by a value obtained by adding the capacity of the first capacitor to a product of a transconductance of the first transistor and a period at which the charge is consumed in the first transistor.

2. The voltage to current converter according to claim 1, wherein
   the charge transfer device comprises a first switch and a second switch that are connected in series between an input terminal of the input voltage and an input node of the current generator at least one end of the first capacitor is connected between the first switch and the second switch, and the first capacitor accumulates or discharges charge corresponding to the input voltage.

3. The voltage to current converter according to claim 2, wherein the smoother comprises a second capacitor that accumulates or discharges charge corresponding to a current caused by discharge of the first capacitor.

4. The voltage to current converter according to claim 3, wherein the current generator comprises a current mirror circuit that comprises a first current path passing a first current corresponding to the accumulated charge in the second capacitor and a second current path passing a second current in proportion to the first current.

* * * * *